United States Patent
Yilmaz et al.

(10) Patent No.: US 7,314,808 B2
(45) Date of Patent: Jan. 1, 2008

(54) METHOD FOR SEQUENCING SUBSTRATES

(75) Inventors: Alpay Yilmaz, San Jose, CA (US); Gerald Alonzo, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 114 days.

(21) Appl. No.: 11/271,242

(22) Filed: Nov. 10, 2005

(65) Prior Publication Data

US 2006/0183408 A1   Aug. 17, 2006

Related U.S. Application Data

(60) Provisional application No. 60/638,493, filed on Dec. 23, 2004.

(51) Int. Cl.
*H01L 21/76* (2006.01)

(52) U.S. Cl. .............................. 438/424; 257/E21.525

(58) Field of Classification Search ............ 438/6, 438/210, 104, 107–114, 118, 121–123, 128–129, 438/135, 142, 145, 149, 151, 157, 176, 478, 438/184, 193, 195–198, 200, 218, 237, 165, 438/294, 308, 337, 353, 378, 401
See application file for complete search history.

(56) References Cited

U.S. PATENT DOCUMENTS

| | | | |
|---|---|---|---|
| 5,944,857 A | 8/1999 | Edwards et al. | |
| 6,244,931 B1 | 6/2001 | Pinson et al. | |
| 6,352,467 B1 | 3/2002 | Somekh et al. | |
| 6,696,367 B1 | 2/2004 | Aggarwal et al. | |
| 7,010,388 B2 * | 3/2006 | Mitchell et al. ............ | 700/218 |
| 2001/0024877 A1 * | 9/2001 | Vepa et al. .................. | 438/691 |
| 2003/0045131 A1 * | 3/2003 | Verbeke et al. ............. | 438/795 |
| 2005/0113964 A1 * | 5/2005 | van der Meulen .......... | 700/213 |
| 2005/0113976 A1 * | 5/2005 | van der Meulen .......... | 700/245 |
| 2006/0246683 A1 * | 11/2006 | Pan et al. .................... | 438/424 |

FOREIGN PATENT DOCUMENTS

EP   1 020 893   7/2000

OTHER PUBLICATIONS

PCT International Search Report and Written Opinion dated Jul. 6, 2006 for PCT/US2005/042169.

* cited by examiner

Primary Examiner—Michael Lebentritt
Assistant Examiner—Andre' Stevenson
(74) Attorney, Agent, or Firm—Patterson & Sheridan

(57) ABSTRACT

Methods for transferring substrates in a system with a factory interface robot between at least one FOUP, a buffer coupled to a parasitic device and an inbound and outbound transfer station coupled to a processing tool are provided. In one embodiment, a method for transferring substrates includes transferring a first substrate on an end effector of a robot from a FOUP to a buffer station serving a parasitic device, moving the substrate from the buffer station into the parasitic device, picking up a second substrate on the end effector, compensating for a residence time of the first substrate in the parasitic device, transferring the second substrate to parasitic device from the end effector to the buffer station serving the parasitic device, and picking up the first substrate from the buffer station.

20 Claims, 4 Drawing Sheets

METHOD FOR SEQUENCING SUBSTRATES

CROSS-REFERENCE TO RELATED APPLICATIONS

This application claims the benefit of co-pending U.S. Provisional Patent Application Ser. No. 60/638,493, filed on Dec. 23, 2004, which is incorporated by reference herein in its entirety.

BACKGROUND OF THE INVENTION

1. Field of the Invention

The present invention generally relates to a semiconductor substrate processing system. More specifically, embodiments of the present invention relate to a method of handling substrates in a factory interface to improve substrate throughput in a semiconductor substrate processing system.

2. Description of the Related Art

In the fabrication of integrated circuits and other electronic devices, multiple layers of conducting, semiconducting and dielectric materials are deposited and removed from a substrate during the fabrication process. Often it is necessary to polish a surface of a substrate to remove high topography, surface defects, scratches or embedded particles. The polishing process is often referred to as chemical mechanical polishing (CMP) and is used to improve the quality and reliability of the electronic devices formed on the substrate.

In general, the polishing process involves holding a substrate against a polishing pad under-controlled pressure and temperature in the presence of a slurry or other fluid medium. Typically, the polishing process involves the introduction of a chemical slurry during the polishing process to facilitate higher removal rates and selectivity between films on the substrate surface. One polishing system that is used to perform CMP is the MIRRA® CMP System available from Applied Materials, Inc. and shown and described in U.S. Pat. No. 5,738,574, entitled "Continuous Processing System for Chemical Mechanical Polishing", the entirety of which is incorporated herein by reference.

One challenge of polishing processes is providing uniform removal of films from the surface of substrates. Removal rate is related to downward pressure on the substrate, rotational speeds of the polishing pad, slurry composition including particle density and size and the effective area of contact between the substrate surface and the polishing pad. Removal rates also tend to be higher at the edge of the substrate as opposed to the center of the substrate.

Another challenge in CMP is the efficient removal of non-uniform layers which have been deposited on the substrate. During fabrication of electronic devices on a substrate, layers are deposited or grown in certain regions on a substrate which may result in an uneven topography over the surface of the substrate. A CMP process can be employed to remove the unwanted non-planar topography on the substrate. The thickness of the films deposited on the substrate can be very thin (on the order of 0.5 to 5.0 microns), thereby allowing little tolerance for non-uniform removal. Thus, CMP processes must be tightly controlled to ensure acceptable polishing results.

In order to monitor the production of the electronic devices and in particular to monitor the results of polishing processes, pre and post processing substrate monitoring systems have been employed on CMP systems. One such monitoring system utilized to determine film thickness is available from Nova Measuring Instruments Ltd., located in Israel (also Nova Measuring Instruments, Inc. located in Sunnyvale, Calif.) and sold as the NovaScan 420. The NovaScan 420 has been used to advantage in a MIRRA® CMP System and provides a wet substrate inspection process to inspect substrates following processing.

One disadvantage with available monitoring systems is their single substrate capacity. As a result, the throughput, i.e., the number of substrates processed per unit of time, is lower than desirable. The available monitoring systems have a single substrate support to receive a single substrate for processing. As a result, the robot transfer system must perform numerous movements to effectuate transfer of an evaluated substrate to a storage location within the system and then retrieve and position another substrate in the monitoring system. The additional movements required of the robot transfer system increase the idle time of the monitoring system and increase the amount of time required for substrate handling, thereby decreasing throughput of substrates in the CMP system.

Therefore, there is a need for an improved methodology for handling substrates to increase the throughput of a CMP tool.

SUMMARY OF THE INVENTION

The present invention generally provides methods for transferring substrates in a system with a factory interface robot between at least one FOUP, a buffer coupled to a parasitic device and an inbound and outbound transfer station coupled to a processing tool. In one embodiment, a method for transferring substrates includes transferring a first substrate on an end effector of a robot from a FOUP to a buffer station serving a parasitic device, moving the substrate from the buffer station into the parasitic device, picking up a second substrate on the end effector, compensating for a residence time of the first substrate in the parasitic device, transferring the second substrate to parasitic device from the end effector to the buffer station serving the parasitic device, and picking up the first substrate from the buffer station.

In another embodiment, a method for transferring substrates includes putting a first inbound substrate from the robot into the buffer and getting a first outbound substrate from the buffer with the robot. The first inbound substrate is transferred form the parasitic device from the buffer. The first outbound substrate is then transferred from the robot into the FOUP and a second outbound substrate is obtained from the outbound transfer station with the robot. The arrival time of the second outbound substrate to the buffer is then synchronized with completion of the loading of the first inbound substrate into the buffer from the parasitic device prior to putting the second outbound substrate from the robot into the buffer and getting the first inbound substrate from the buffer with the robot. The first inbound substrate is then transferred from the robot into the inbound transfer station and a second inbound substrate is obtained from the FOUP with the robot. The arrival time of the second inbound substrate to the buffer is then synchronized with completion of the loading of the second outbound substrate into the buffer by the parasitic device.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention provides methods for the transfer of substrates in a processing system with a factory interface robot at increased substrate throughput rates. Specifically, the method provides a sequence for the transfer of substrates in a processing system between at least one front-opening unified pod (FOUP), a buffer coupled to a parasitic device (in one example, a thickness measurement device, such as available from Nova, Nanometrics, Applied Materials, Inc., among others), and an inbound and outbound transfer station coupled to a processing tool. The term parasitic device as used herein refers to additional devices or processing steps, whether automated or manual, that handle a substrate within a process cycle, thereby adding to the overall process time required to process the substrate. The parasitic device may have a parasitic processing time that requires the factory interface robot (or other robot) to wait (often with a substrate on the blade of the robot) for the parasitic device to become available before introducing the substrate into the parasitic device (e.g., the parasitic device is occupied and processing one substrate while the robot waits with another substrate for the parasitic device to complete processing). Examples of parasitic devices include, but are not limited to, aligners, thermal processing stations, substrate flippers, spin rinse drying stations, metrology stations (such as optical measurement stations), and the like.

Figure 1:
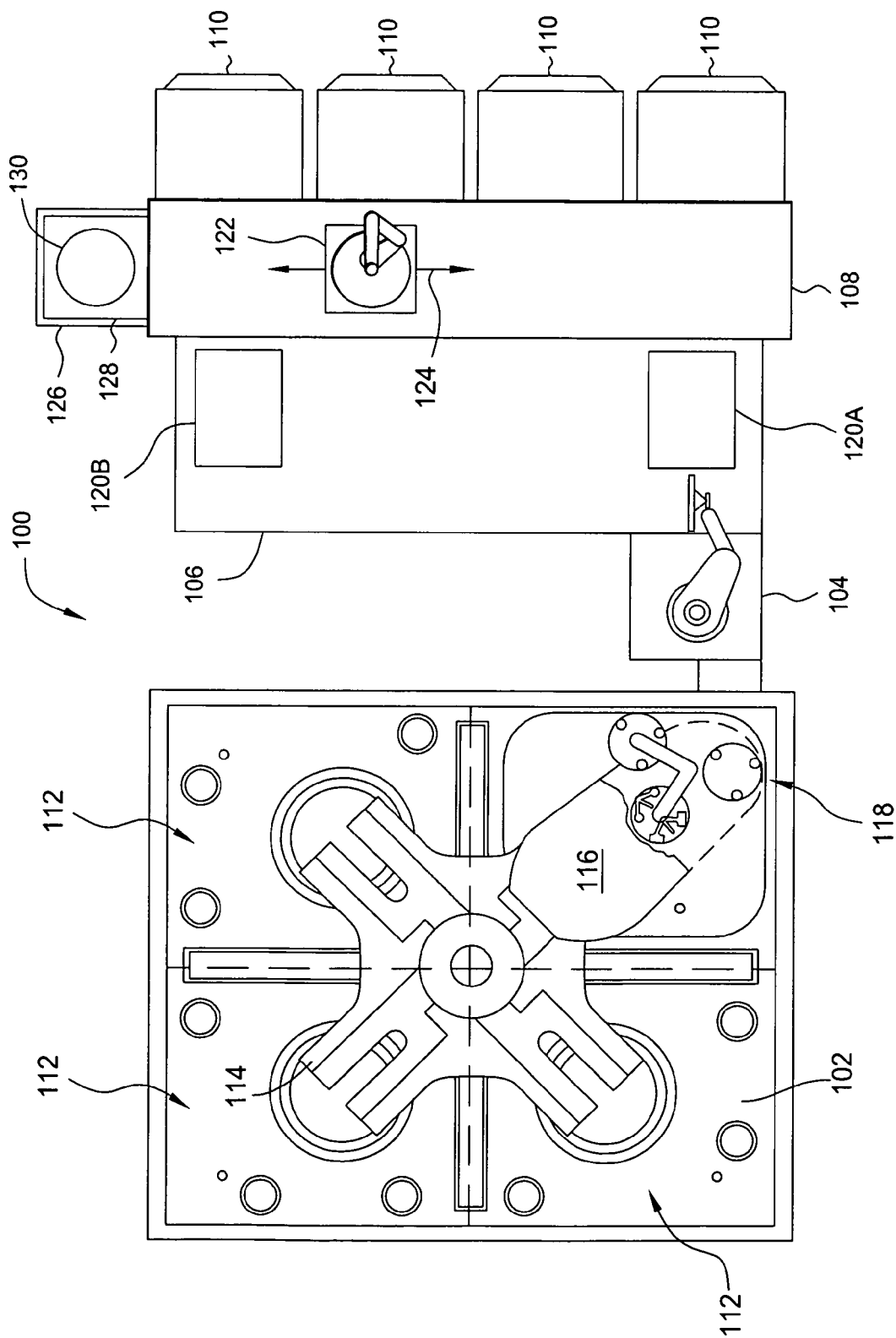
FIG. 1 is a simplified plan view of one embodiment of a processing system suitable for use with the present invention.

FIG. 1 depicts a semiconductor substrate polishing system 100, such as the REFLEXION® LK CMP system, available from Applied Materials, Inc. of Santa Clara, Calif. Examples of other suitable systems for use with the methods of the present invention include the REFLEXION LK Ecmp™ system, CENTURA®, ENDURA® and PRODUCER® processing systems, also available from Applied Materials. It is contemplated that other polishers, cluster tools or other substrate processing tools may be utilized.

The system 100 is comprised of a polisher 102, a wet robot 104, a cleaner 106, a factory interface module 108, and one or more front-opening unified pods (FOUPs) 110. The polisher 102 has a plurality of polishing stations 112, a robot 114, a robot interface 116 and a transfer station 118. A chemical mechanical polishing process may be performed at any of the polishing stations 112. The robot 114 is centrally located within the polisher 102 and is capable of moving a substrate to the polishing stations 112 and the robot interface 116. The robot interface 116 allows for the substrate to be shuttled between the transfer station 118 and the robot 114.

The cleaner 106 is disposed proximate the polisher 102. One or more transfer stations are provided to facilitate transfer of substrates into and out of the cleaner 106. In the embodiment depicted in FIG. 1, an inbound transfer station 120A and an outbound transfer station 120B are disposed at opposing ends of the cleaner 106. The cleaner 106 operates to wash off any contaminants remaining on the substrate after it leaves the polisher 102, for example, by spraying the substrate with a cleaning fluid. The substrate may additionally scrubbed and cleaned megasonically. An example of a suitable cleaner 106 is the DESICA® cleaner, available from Applied Materials, Inc., of Santa Clara, Calif.

The wet robot 104 transfers substrates between the transfer station 120A of the cleaner 106 and the transfer station 118 of the polisher 102. The wet robot 104 retrieves the substrate from the transfer station 120A, orientates the substrate horizontally and feature side down, and places the substrate on the transfer station 118. The process is repeated in reverse to remove substrates from the polisher 102.

The factory interface module 108 is substantially rectangular in shape and is generally disposed between the cleaner 106 and the FOUPs 110. A factory interface robot 122 is housed within the factory interface module 108. The factory interface robot 122 may be mounted to a rail (not shown) or other mechanism that facilitates lateral movement of the robot 122 as indicated by arrows 124. The factory interface robot 122 may be, for example, a model Equipe 407B, manufactured by PRI Automation, or like robot capable of providing the range of motion required for the successful operation of the invention.

Figure 3:
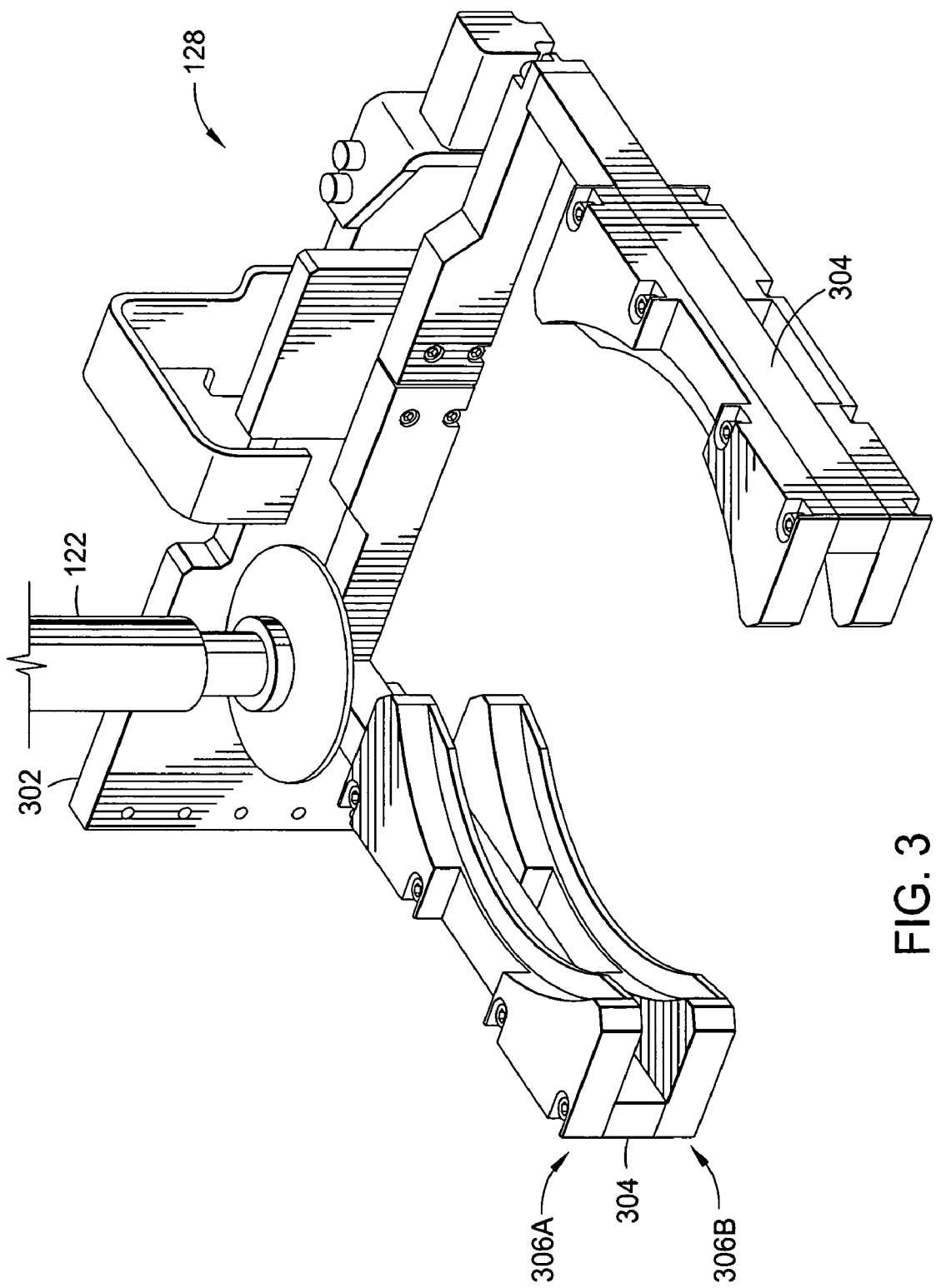
FIG. 3 is an isometric view of one embodiment of a substrate buffer.

In addition to the above components of the system 100, a parasitic device 126 may also be attached to the system 100. In one embodiment, the parasitic device is a film thickness and/or critical dimension measuring device, which may utilized eddy current and/or optical metrology techniques. The parasitic device 126 performs a desired additional process on the substrate, such as substrate orientation, thermal processing, optical metrology, critical dimension measurement, film thickness profiling or some other metrology process, and the like. For example, one parasitic device 126 often used in processing systems 100 as described above is a thickness profiler. A buffer 128 is coupled to the parasitic device 126 to facilitate increased substrate throughput by facilitation of substrate handoff between the factory interface robot 122 and an internal robot 130 of the parasitic device 126. In one embodiment, the buffer 128, as described in more detail in FIG. 3, is mounted to the parasitic device 126 by a mounting bracket 302. An opposing pair of support arms 304 extend from the bracket 302. A pair of vertically stacked substrate holders 306A, 306B are affixed to the support arms 304 and are positioned to hold a single substrate in each substrate holder. The vertical orientation of the holders 306A, 306B conserves valuable space in the factory interface module 108, thereby allowing incorporation of the parasitic device 126 into the module 108 while still conforming to SEMI specifications for factory interfaces.

The support arms 304 are movable relative to the bracket 302 to facilitate placing the substrate holders 306A, 306B in an open position, wherein a substrate can pass vertically through the space between the holders (into and out of the parasitic device 126 on the internal robot 130), and a closed position, wherein a substrate can be supported by the holders 306A, 306B (in a position above the parasitic device 126). One such suitable buffer is described in more detail in U.S.

Pat. No. 6,244,931, issued Jun. 12, 2001 to Pinson, et al., and which is hereby incorporated by reference in its entirety.

As the pair of substrate holders 306A, 306B move in tandem, the support arms must remain closed whenever a substrate is present in one of the holders 306A, 306B to prevent the substrate from falling. As such, whenever the factory interface robot 122 is ready to load a substrate into the parasitic device 126 when another substrate is presently in the parasitic device 126, the factory interface robot 122 must wait until the parasitic device 126 is finished processing and the processed substrate is placed into one of the holders 306A, 306B of the buffer 128 prior to placing the substrate into the remaining empty holder 306A or 306B of the buffer 128. Once the substrate is placed in the holder 306A or 306B by the robot 122, the processed substrate may be retrieved from the buffer 128 by the robot 122 and the parasitic device 126 may load the unprocessed substrate from the buffer 128. The specific orientation of the parasitic device 126 and the buffer 128 is not limiting of the invention and it is contemplated that other configurations of buffers 128 and parasitic devices 126 may be utilized, including parasitic devices with integrated buffers or non-vertically stacked buffers.

Due to the amount of time necessary for the parasitic device 126 to load, process, and unload a substrate, a reduction in substrate throughput occurs in the system 100, even with the utilization of the buffer 128. A method as described below for sequencing a substrate with a factory interface robot in a system having a substrate storage device, a parasitic device having a substrate buffer, and a tool may be advantageously utilized to increase the substrate throughput through the system 100. Although described with reference to the CMP system 100 described with reference to FIG. 1, the method for sequencing substrates within a factory interface module may be advantageous in other systems having factory interface modules as discussed further below.

Figure 4:
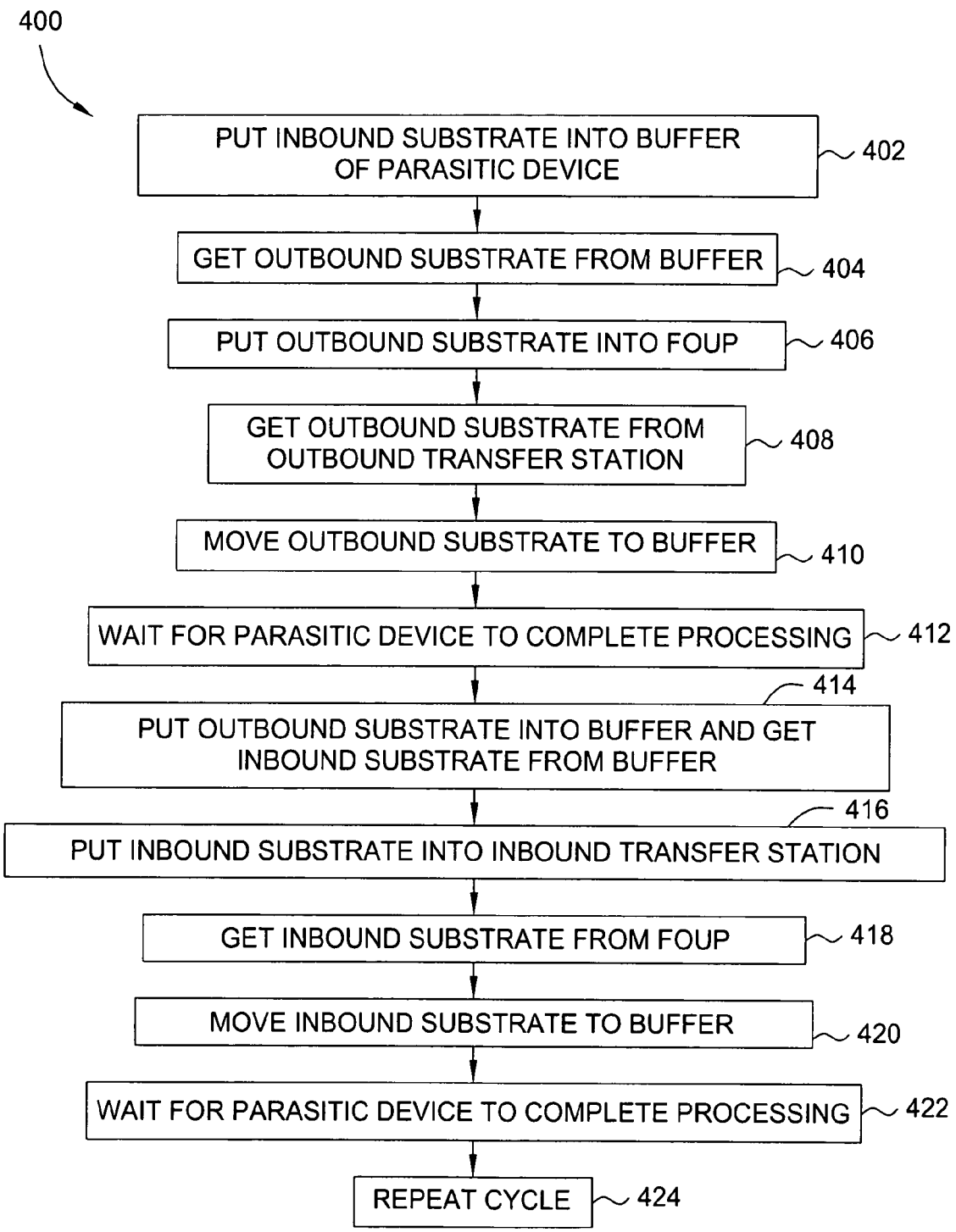
FIG. 4 is a flowchart of one embodiment of a sequence for transferring substrates.

One embodiment of such a method 400 (shown in FIG. 4) is described below with reference to the polishing system of FIG. 1. The method 400 is described with reference to a steady state operation wherein substrates are entering into and being removed from the tool—as opposed to a start-up or shut-down state. For clarity and ease of reference, the cycle for the substrate sequencing method 400 is described as beginning with an inbound substrate in the factory interface robot 122 immediately prior to placing the inbound substrate into the buffer 128 of the parasitic device 126. An outbound substrate is in the buffer 128 of the parasitic device 126 and has been measured by the parasitic device 126. The parasitic device 126, is this example, is a thickness measuring device.

As used herein, the term "inbound substrate" refers to a substrate that is to be processed in the tool, e.g., the polisher 102. Similarly, the term "outbound substrate" refers to a substrate that has already been processed by the tool. It is contemplated that the method 400 could begin at any point in the substrate sequencing cycle. The term FOUP 110 refers to any FOUP coupled to the factory interface module 108.

The sequencing method 400 begins at step 402 where the factory interface robot 122 places an inbound substrate into one of the holders 306A, 306B of the buffer 128 of the parasitic device 126, such as a thickness profiler to obtain an initial thickness profile. Next, at step 404, the factory interface robot 122 retrieves a measured outbound substrate from the buffer 128 of the parasitic device 126. Once the measured outbound substrate is removed from the buffer 128, the inbound substrate may be loaded into the parasitic device 126 from the buffer 128 by the parasitic device's internal robot 130. Assuming the measured profile of the outbound substrate is satisfactory (e.g., within predefined tolerances), the factory interface robot 122 then moves the measured outbound substrate to an empty location in the FOUP 110 at step 406 and loads the substrate into the FOUP 110.

Next, at step 408, the factory interface robot 122 moves to the transfer station 120B to retrieve an outbound substrate from the polisher 102. At step 410, the factory interface robot 122 moves the outbound substrate from the transfer station 120B to the buffer station 128 of the parasitic device 126 (e.g., to obtain a final thickness profile from the device 126).

As discussed above, the parasitic device 126 must complete processing of the inbound substrate and have placed the measured inbound substrate into the buffer 128 prior to swapping substrates with the factory interface robot 122. As such, if the timing of substrate processes and robot moves were to make the factory interface robot 122 arrive at the buffer 128 prior to the completion of processing by the parasitic device 126, a different sequence would conventionally be used. This is due to the prevailing conventional wisdom in the industry that waiting with a substrate always wastes time and negatively affects substrate throughput. Specifically, when determining transfer sequences for substrates between multiple locations within a processing system, the conventional wisdom is that the substrates should be moving between desired locations whenever possible. Due to the high cost of the processing equipment and the high cost of operating such equipment, waiting or idling a robot carrying a substrate is seen as a reduction in substrate throughput, and therefore an increase in the cost of manufacture per substrate. Moreover, idling with a substrate on the blade of the robot may increase the risk of misalignment or damage of the substrate, further discouraging idling with the substrate retained by the robot.

However, in the embodiments of the method described herein, it was unexpectedly found that the system substrate throughput could be increased by compensating for the parasitic processing time by synchronizing the arrival time of the robot with a substrate to be loaded into the buffer of the parasitic device with the completion of processing of a substrate in the parasitic device. For example, the factory interface robot 122 may wait while retaining a substrate for transfer to the parasitic device 126, rather than altering the sequence to prevent the factory interface robot 122 from waiting (i.e., idling) while retaining a substrate. The robot 122 may wait at the buffer 128 with the substrate retained on the blade of the robot 122, or the robot 122 may wait at an earlier stage, such as immediately prior to or immediately after picking up the substrate heading for the parasitic device 126. Alternatively, the speed of the robot 122 may be adjusted, at least temporarily, to synchronize the arrival time of the robot 122 at the buffer 128.

In one embodiment, the factory interface robot 122 waits at step 412 with the outbound substrate at the buffer 128 for the parasitic device 126 to complete processing and place the measured inbound substrate into the buffer 128. Alternatively, the factory interface robot 122 may wait upon initially picking up the outbound substrate from the transfer station 120A, and/or the speed of the factory interface robot 122 may be adjusted to synchronize the arrival time at the buffer 128 of the substrate carried by the factory interface robot 122 with the insertion into the buffer 128 of the measured substrate coming out of the parasitic device 126. In the system 100 depicted in FIG. 1, the critical residence time of a substrate within the parasitic device 126 is about 10-25 seconds, which the factory interface robot 122 must wait to exchange substrates at the buffer 128. It is contemplated that other systems will have different critical residence times.

After the inbound substrate is placed in the buffer 128 by the internal robot 130, the factory interface robot 122 places the outbound substrate into the buffer 128 and picks up the inbound substrate from the buffer 128 at step 414. At step 416, the factory interface robot 122 moves to the transfer station 120A and places the inbound substrate into the transfer station 120A so that it may be transferred to the tool for processing. The factory interface robot 122 then moves to the FOUP 110 and gets a new inbound substrate at step 418.

At step 420, the factory interface robot 122 moves the inbound substrate to the buffer 128 of the parasitic device 126. At step 422, a synchronizing routine is performed as discussed above. For example, the factory interface robot 122 waits for processing to be completed in the parasitic device 126 and the measured substrate placed in the buffer 128 prior to placing the new inbound substrate into the buffer 128 of the parasitic device 126. As discussed above with respect to step 412, the robot 122 may alternatively wait at other locations or the operational speed of the robot 122 may be adjusted to synchronize the swap of substrates at the buffer 128 of the parasitic device 126.

With respect to the starting point of the sequence, one cycle is completed at this point. Assuming steady state conditions, this cycle may be repeated continuously as desired to continue processing substrates. The above-described sequence for transferring substrates may be used where the parasitic process time (e.g., the time elapsing between initially placing a substrate into the buffer 128 by the robot 122 and the subsequent placing of the same substrate into the buffer 128 by the parasitic device 126 after processing) is greater than the time required to transfer the other respective substrates in the system as described above. Utilizing the inventive method in such a situation, system substrate throughput can be obtained at levels of about 55 substrates per hour or greater, as compared with systems without a buffer that have throughputs of about 20-25 substrates per hour (based on 10-25 second residence time within the parasitic device, typically required for sampling 9-13 points for thickness measurements).

For example, in the embodiment described above, the parasitic process time would be greater than the time required to move the robot from the buffer to the FOUP with the first outbound substrate, put the first outbound substrate into the FOUP, move the robot from the FOUP to the outbound transfer station, get the second outbound substrate from the outbound transfer station, and move the robot from the outbound transfer station to the buffer.

As another example, in the embodiment described above, the parasitic process time would be greater than the time required to move the robot from the buffer to the inbound transfer station with the first inbound substrate, put the first inbound substrate into the inbound transfer station, move the robot from the inbound transfer station to the FOUP, get the second inbound substrate from the FOUP, and move the robot form the FOUP to the buffer.

Figure 2:
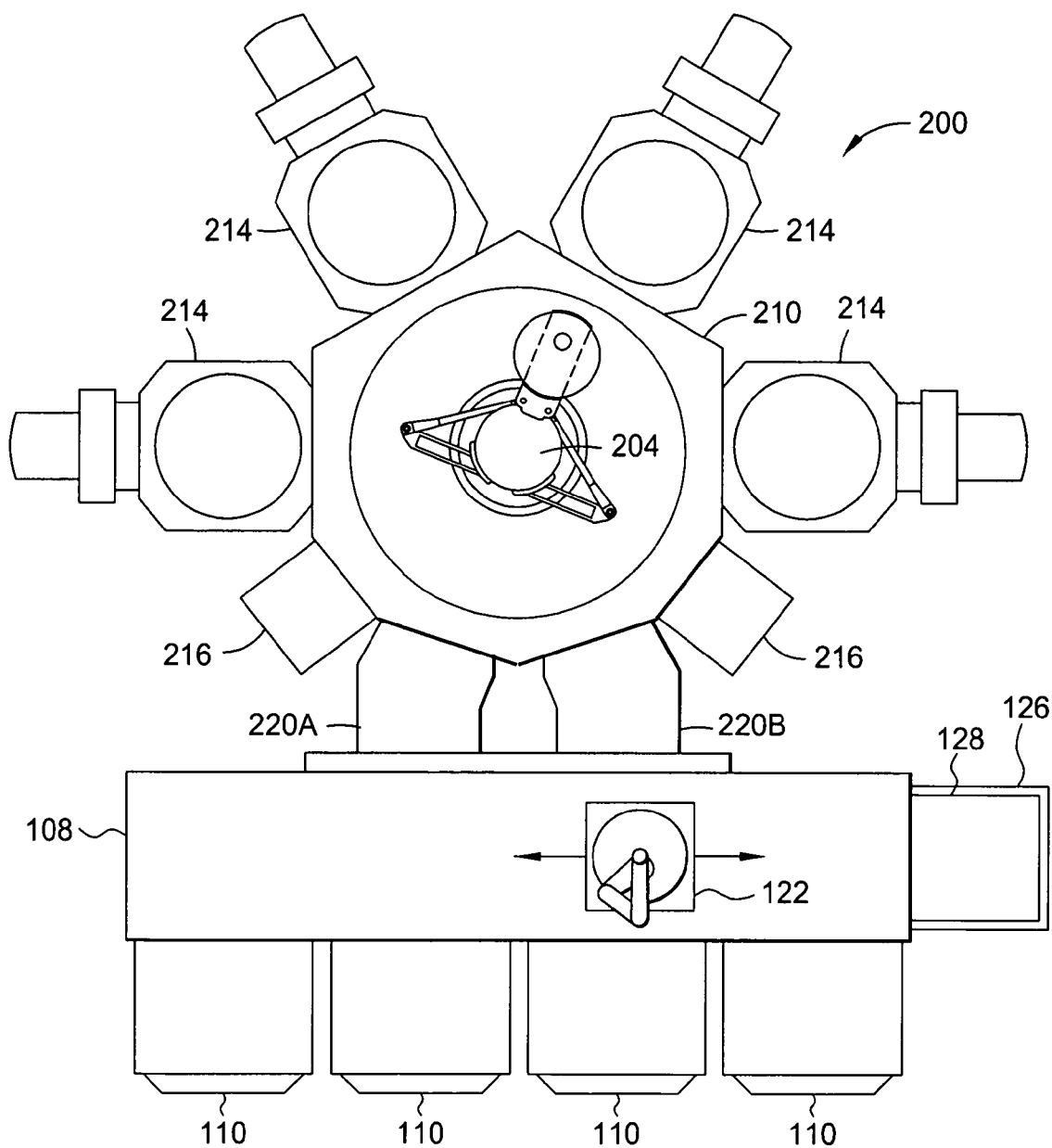
FIG. 2 is a simplified plan view of another embodiment of a processing system suitable for use with the present invention.

Alternatively, the method as described hereinabove may be utilized in other processing systems where a substrate is transferred between substrate storage device, a parasitic device having a substrate buffer, and a tool. For example, FIG. 2 depicts a simplified plan view of an exemplary cluster tool 200 for semiconductor processing wherein the present invention may be used to advantage. The cluster tool 200 generally comprises a central vacuum transfer chamber 210 about which a plurality of process chambers 214 are mounted. The process chambers 214 are selected to perform specific processes on a semiconductor substrate as desired, for example deposition or etching of materials on the substrate. Additional chambers 216, such as cool-down or de-gas chambers may also be mounted to the transfer chamber 110.

An inbound load lock 220A and an outbound load lock 220B are provided to facilitate ingress and egress of the substrate to and from the transfer chamber 110 and are analogous to the transfer stations 120A, 120B with respect to the method 400 when practiced within the system 200. A robot 204 is typically disposed within the transfer chamber 210 to facilitate transfer of substrates between the process chambers 214 and the load locks 220A and 220B. The factory interface module 108 abuts the load locks 220A and 220B such that the factory interface robot 122 may transfer substrates between the load locks 220A, 220B and the FOUPs 110 during processing. It is contemplated that a single load lock capable of handling multiple substrates may be used for both ingress and into egress from the transfer chamber 110.

Platforms, for example, suitable for advantageous use of the methods disclosed herein include the CENTURA®, PRODUCER™, ENDURA® processing platforms, both available from Applied Materials, Inc., of Santa Clara, Calif, as well as other systems available from other manufacturers. The details of one such staged-vacuum substrate processing system are disclosed in U.S. Pat. No. 5,186,718, entitled "Staged-Vacuum Substrate Processing System and Method," Tepman et al., issued on Feb. 16, 1993, which is incorporated herein by reference. It is contemplated that other cluster tools and processing systems may also benefit from the invention disclosed herein.

While the foregoing is directed to embodiments of the present invention, other and further embodiments of the invention may be devised without departing from the basic scope thereof, and the scope thereof is determined by the claims that follow.

What is claimed is:

1. A method for the transfer of substrates in a system with a factory interface robot between at least one FOUP, a buffer station coupled to a parasitic device and an inbound and outbound transfer station coupled to a processing tool, the method sequentially comprising:
   transferring a first substrate on an end effector of the factory interface robot from a FOUP to the buffer station serving the parasitic device;
   moving the first substrate from the buffer station into the parasitic device;
   picking up a second substrate on the end effector from the outbound transfer station of the processing tool;
   compensating for a residence time of the first substrate in the parasitic device;
   transferring the second substrate from the end effector to the buffer station serving the parasitic device; and
   picking up the first substrate from the buffer station.

2. The method of claim 1, wherein the step of compensating further comprises:
   waiting to move the second substrate while the second substrate is disposed on the end effector.

3. The method of claim 2, wherein the step of waiting further comprises:
   moving the second substrate to a position adjacent the buffer station then waiting for the parasitic device to be ready to accommodate the second substrate.

4. The method of claim 2, wherein the step of waiting further comprises:
   waiting for the parasitic device to be ready to accommodate the second substrate then moving the second substrate to a position adjacent the buffer station.

5. The method of claim 1, wherein the step of compensating further comprises:
slowing a speed of end effector movement.

6. The method of claim 1, wherein the step of compensating further comprises:
synchronizing the robot motion with the completion of processing at the parasitic device.

7. The method of claim 1 further comprising:
measuring a thickness of a layer disposed on the first substrate in the parasitic device.

8. The method of claim 1 further comprising: measuring a critical dimension of a feature defined on the first substrate in the parasitic device.

9. The method of claim 1 further comprising:
performing at least one of substrate orientation, thermal processing, optical metrology, critical dimension measurement or film thickness profiling in the parasitic device.

10. The method of claim 1 further comprising:
transferring the first substrate to the inbound transfer station of the processing tool;
planarizing the first substrate in the processing tool; and
transferring the second substrate to the FOUP.

11. A method for the transfer of substrates in a system with a factory interface robot between at least one FOUP, a buffer coupled to a parasitic device and an inbound and outbound transfer station coupled to a processing tool, the method sequentially comprising:
(a) putting a first inbound substrate from the robot into the buffer;
(b) getting a first outbound substrate from the buffer with the robot;
(c) putting the first outbound substrate from the robot into the FOUP;
(d) getting a second outbound substrate from the outbound transfer station with the robot;
(e) synchronizing the arrival time of the second outbound substrate to the buffer with completion of the loading of the first inbound substrate into the buffer by the parasitic device;
(f) putting the second outbound substrate from the robot into the buffer and getting the first inbound substrate from the buffer with the robot;
(g) putting the first inbound substrate from the robot into the inbound transfer station;
(h) getting a second inbound substrate from the FOUP with the robot; and
(i) synchronizing the arrival time of the second inbound substrate to the buffer with completion of the loading of the second outbound substrate into the buffer by the parasitic device.

12. The method of claim 11, further comprising repeating the steps after completion of the last step.

13. The method of claim 11, wherein the synchronizing step (e) further comprises at least one of waiting with the second outbound substrate retained by the robot or adjusting the speed of the robot between step (d) and step (f).

14. The method of claim 11, wherein the synchronizing step (i) further comprises at least one of waiting with the second inbound substrate retained by the robot or adjusting the speed of the robot between step (h) and a repeat of step (a).

15. The method of claim 11, wherein the parasitic processing time is greater than the time required to move the robot from the buffer to the FOUP with the first outbound substrate, put the first outbound substrate into the FOUP, move the robot from the FOUP to the outbound transfer station, get the second outbound substrate from the outbound transfer station, and move the robot from the outbound transfer station to the buffer.

16. The method of claim 11, wherein the parasitic processing time is greater than the time required to move the robot from the buffer to the inbound transfer station with the first inbound substrate, put the first inbound substrate into the inbound transfer station, move the robot from the inbound transfer station to the FOUP, get the second inbound substrate from the FOUP, and move the robot form the FOUP to the buffer.

17. A method for the transfer of substrates in a system with a factory interface robot between at least one FOUP, a buffer coupled to a parasitic device and an inbound and outbound transfer station coupled to a processing tool, the method sequentially comprising:
(a) putting a first inbound substrate from the robot into the buffer;
(b) getting a first outbound substrate from the buffer with the robot;
(c) putting the first outbound substrate from the robot into the FOUP;
(d) getting a second outbound substrate from the outbound transfer station with the robot;
(e) moving the second outbound substrate to the buffer with the robot;
(f) waiting with the second outbound substrate retained by the robot at the buffer for the parasitic device to complete processing of the first inbound substrate and to load the first inbound substrate into the buffer;
(g) putting the second outbound substrate from the robot into the buffer and getting the first inbound substrate from the buffer with the robot;
(h) putting the first inbound substrate from the robot into the inbound transfer station;
(i) getting a second inbound substrate from the FOUP with the robot;
(j) moving the second inbound substrate to the buffer with the robot; and
(k) waiting with the second inbound substrate retained by the robot at the buffer for the parasitic device to complete processing and to load the second outbound substrate into the buffer.

18. The method of claim 17, further comprising repeating the steps after completion of the last step.

19. The method of claim 17, wherein the parasitic processing time is greater than the time required to move the robot from the buffer to the FOUP with the first outbound substrate, put the first outbound substrate into the FOUP, move the robot from the FOUP to the outbound transfer station, get the second outbound substrate from the outbound transfer station, and move the robot from the outbound transfer station to the buffer.

20. The method of claim 17, wherein the parasitic processing time is greater than the time required to move the robot from the buffer to the inbound transfer station with the first inbound substrate, put the first inbound substrate into the inbound transfer station, move the robot from the inbound transfer station to the FOUP, get the second inbound substrate from the FOUP, and move the robot form the FOUP to the buffer.

* * * * *